(12) United States Patent
Kobayashi

(10) Patent No.: US 7,524,684 B2
(45) Date of Patent: Apr. 28, 2009

(54) SEMICONDUCTOR DEVICE WITH ELECTRODE PAD HAVING PROBE MARK

(75) Inventor: Tatehito Kobayashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/898,138

(22) Filed: Sep. 10, 2007

(65) Prior Publication Data

US 2008/0009083 A1    Jan. 10, 2008

Related U.S. Application Data

(63) Continuation of application No. 10/958,413, filed on Oct. 6, 2004, now Pat. No. 7,279,706.

(30) Foreign Application Priority Data

Oct. 7, 2003 (JP) .............................. 2003-347899

(51) Int. Cl.
*H01L 21/66* (2006.01)
(52) U.S. Cl. ...................... 438/15; 438/14; 438/16; 438/E21.529; 438/E21.53
(58) Field of Classification Search .................. 438/14, 438/15, 18, E21.529, E21.53
See application file for complete search history.

(56) References Cited

U.S. PATENT DOCUMENTS

| 4,415,115 | A | * | 11/1983 | James ......................... 228/170 |
| 4,885,533 | A | * | 12/1989 | Coe ............................ 324/754 |
| 5,731,710 | A | * | 3/1998 | Mizuno et al. ............... 324/761 |
| 5,773,987 | A | | 6/1998 | Montoya |
| 6,150,727 | A | | 11/2000 | Takagi |
| 6,297,561 | B1 | | 10/2001 | Liu et al. |
| 6,563,226 | B2 | | 5/2003 | Harun et al. |
| 6,579,734 | B2 | * | 6/2003 | Aoki ............................ 438/15 |
| 6,597,187 | B2 | | 7/2003 | Eldridge et al. |
| 6,765,228 | B2 | | 7/2004 | Lin et al. |
| 2003/0107137 | A1 | | 6/2003 | Stierman et al. |

FOREIGN PATENT DOCUMENTS

| JP | 8-8290 | 1/1996 |
| JP | 10-56030 | 2/1998 |
| JP | 2001-338955 | 12/2001 |

* cited by examiner

*Primary Examiner*—Davienne Monbleau
*Assistant Examiner*—Eduardo A Rodela
(74) *Attorney, Agent, or Firm*—McDermott Will & Emery LLP

(57) ABSTRACT

A semiconductor device is formed by bonding bonding balls to a plurality of electrode pads formed on a semiconductor chip. After a wafer test is conducted by pressing a probe against the electrode pad, wire-bonding of the electrode pad to a lead is carried out so that a probe mark formed in the electrode pad during the wafer test is completely covered by a bonding ball, which forms an end of a wire connected to the lead.

5 Claims, 3 Drawing Sheets

SEMICONDUCTOR DEVICE WITH ELECTRODE PAD HAVING PROBE MARK

RELATED APPLICATIONS

This application is a Continuation of U.S. application Ser. No. 10/958,413, filed Oct. 6, 2004 now U.S. Pat. No. 7,279, 706, claiming priority of Japanese Application No. 2003-347899, filed Oct. 7, 2003, the entire contents of each of which are hereby incorporated by reference.

FIELD OF THE INVENTION

The present invention relates to a semiconductor device and to a method of manufacturing the same, wherein bonding balls are bonded to electrode pads which have (a) probe mark(s).

DESCRIPTION OF THE BACKGROUND ART

There has been known a manufacturing method of a semiconductor device includes a wire-bonding process for bonding bonding balls to electrode pads.

In accordance with the recent narrowing of pitch of electrode pads, a technique where the shape of the bonding balls is changed from round to oval has been suggested in, for example, Japanese non-examined laid-open patent publication No. Hei 10-56030 (page 2).

In a wafer test conducted prior to wire-bonding, a process for pressing a probe against electrode pads, i.e., probing, is carried out. For this reason, probe marks appear in the electrode pads after the wafer test. Since a part of the bonding ball directly upon a probe mark does not contribute to the bonding, there is a problem that the area of bonding of the electrode with the bonding ball becomes smaller compared to the bonding area when there are no probe marks.

Further, an offset occurs in the form of the bonding surface of the surface of the electrode pads with the back surfaces of the bonding balls along the shape of a probe mark. Accordingly, as shown in FIGS. 7A and 7B, during the loop pull test conducted after the wire-bonding, the part of the bonding ball 2 directly upon the probe mark 1 is lifted first, and a momental force occurs to the bonding ball 2. Consequently, there is a problem that the electrode pads 3 peel off during loop pull test. FIG. 7B is a cross-sectional view taken along line B-B' of FIG. 7A.

Moreover, as shown in FIG. 8, in the case where a plurality of probe marks 1 exist in an electrode pad 3, small-area junction parts 5 exist in the gap between the probe marks 1. Also in this case, tensile stress is applied to the small-area junction parts 5 during loop pull test. For this reason, there is a problem that the electrode pads 3 peel off during loop pull test due to stress concentration.

SUMMARY OF THE INVENTION

The present invention has been conceived to solve the previously-mentioned problems and a general object of the present invention is to provide a novel and useful semiconductor device and is to provide a novel and useful method for manufacturing a semiconductor device.

A more specific object of the present invention is to control peeling of electrode pads during loop pull test.

According to first aspect of the present invention, the semiconductor device comprises a semiconductor chip; an electrode pad formed on the semiconductor chip and having a probe mark therein; and a bonding ball bonded to the electrode pad. The probe mark is completely covered by the bonding ball.

According to second aspect of the present invention, the semiconductor device comprises a semiconductor chip; an electrode pad formed on the semiconductor chip and having a plurality of probe marks therein; and a bonding ball bonded to the electrode pad. The plurality of probe marks is crossed each other at angles between degrees of 70 and 110.

According to third aspect of the present invention, the semiconductor device comprises a semiconductor chip; an electrode pad formed on the semiconductor chip and having a plurality of probe marks therein; and a bonding ball bonded to the electrode pad. The plurality of probe marks has curved shapes in its entirety.

Other objects and further features of the present invention will be apparent from the following detailed description when read in conjunction with the accompanying drawings.

DETAILED DESCRIPTION OF THE PREFERRED EMBODIMENTS

Figure 1A:
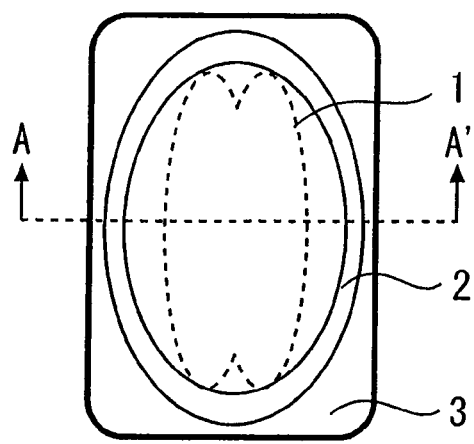
FIGS. 1A and 1B are drawings for showing the semiconductor device according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

Figure 1B:
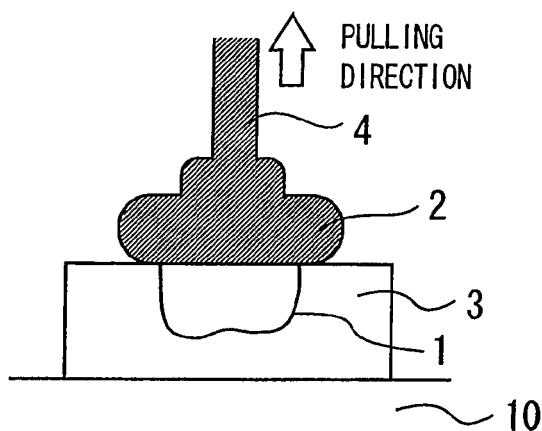

FIGS. 1A and 1B are drawings for showing the semiconductor device according to the first embodiment of the present invention. Specifically, FIG. 1A is a top view for showing the bonding part of an electrode pad with a bonding ball and the vicinity thereof, and FIG. 1B is a cross-sectional view taken along line A-A'.

As shown in FIGS. 1A and 1B, a plurality of electrode pads 3 made of an aluminum thin film is formed on a semiconductor chip 10. An electrode pad 3 is rectangular with the short side in the pad-pitch direction (the horizontal direction in FIG. 1A), limited by the mechanism of the probing device. In the electrode pad 3, a probe mark 1, which is made by the pressing of the probe during wafer test, exists. For example, the probe mark 1 is a linear scratch when a cantilever-type probe is used. A bonding ball 2 is bonded to the electrode pad 3 so as to completely cover the probe mark 1. The bonding ball 2 forms one end of a wire 4, and the other end of the wire 4 is connected to a lead (not shown). Taking in consideration the recent pitch narrowing of electrode pads 3, 45 µm and below, for example, would be favorable as the diameter of a bonding ball 2.

The above-mentioned scratch-type is not the only shape of a probe mark; and probe marks of other shapes also exist.

Figure 2A:
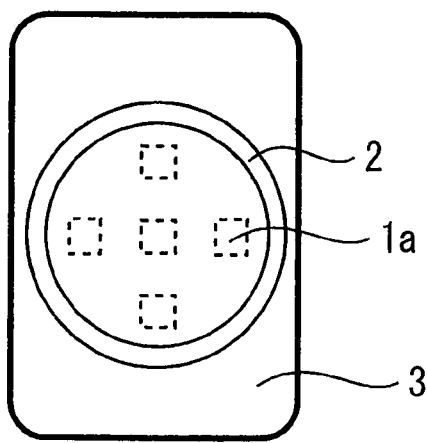
FIGS. 2A and 2B are top views for showing other examples of probe marks according to the first embodiment of the present invention.
Figure 2B:
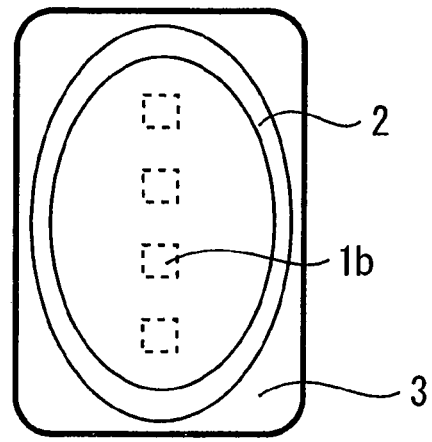

FIGS. 2A and 2B are top views for showing other examples of probe marks according to the first embodiment of the present invention.

In the case where a vertical-type probe or a thin-film-type probe is used for conducting a wafer test, a plurality of probe marks 1a or 1b like dot-like marks or dents is formed in an electrode pad 3. Also in this case, a bonding ball 2 is bonded to the electrode pad 3 so as to completely cover the probe marks 1a or 1b.

Further, the shape of the bonding surface of the bonding ball 2 may be any round or oval shape, provided that the probe marks are completely covered.

Next, the method of manufacturing the above-described semiconductor device will be explained. Here, explanation will be given mainly on the wire-bonding process.

A plurality of electrode pads 3 made of an aluminum thin film is formed on the vicinity of the periphery of a semiconductor chip 10.

Next, a wafer test is carried out by pressing a cantilever-type probe against the electrode pad 3. During the wafer test, a scratch-like probe mark 1 is made on the electrode pad 3.

Then, the electrode pad 3 on the semiconductor chip 10 and a lead of a lead frame which fixes the semiconductor chip 10 are wire-bonded together. At this time, the probe mark 1 in the electrode pad 3 is completely covered by a bonding ball 2, which forms one end of a wire 4. The wire 4 is, for example, made of Gold.

Figure 8:
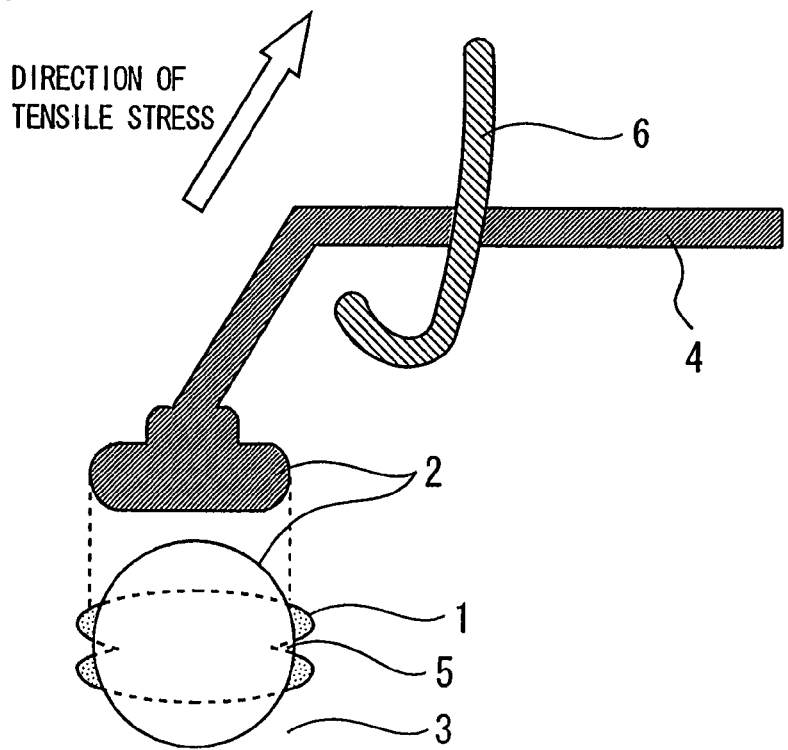

Further, a loop pull test (pull test) is conducted by hooking a hook 6 over the loop of the wire 4 and pulling the hook 6 upwards. FIG. 1B shows a case where a loop pull test is conducted in the direction vertical to the electrode pad 3. However, there are also cases in which the loop pull test is conducted by pulling the hook 6 at a certain angle (refer to FIG. 8). Since the probe mark 1 is not exposed outside the bonding ball 2 during the loop pull test, no momental force as generated in the conventional method of manufacturing a semiconductor device is generated.

As explained above, in the first embodiment of the present invention, in wire-bonding the electrode pad 3 with the lead, the bonding ball 2 is bonded with the electrode pad 3 so as to completely cover the probe mark 1 made during the wafer test. Accordingly, the bonding area of the electrode pad 3 with the bonding ball 2 can be increased compared to the conventional semiconductor device, and thus, a bonding strength stronger than the conventional semiconductor device can be obtained. Also, since the probe mark 1 is not exposed outside the bonding ball 2, no momental force as applied in the conventional method of manufacturing a semiconductor is applied to the bonding ball 2 during loop pull test. Furthermore, since no small-area junction parts exist in the gap between probe marks as in the conventional semiconductor device in the case where a plurality of probe marks exists, tensile stress does not concentrate on particular parts during loop pull test.

Accordingly, peeling of electrode pads 3 during loop pull test can be inhibited.

Second Embodiment

In the above-described first embodiment, concentration of tensile stress during loop pull test is avoided by enlarging the diameter of the bonding ball 2. In the second embodiment of the present invention, concentration of tensile stress during loop pull test is controlled by making appropriate the shape of the probe marks.

Figure 3:
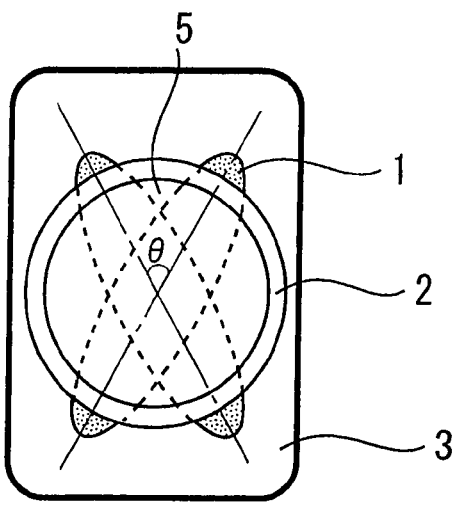
FIG. 3 is a top view for showing the semiconductor device according to a second embodiment of the present invention.

FIG. 3 is a top view for showing the semiconductor device according to the second embodiment of the present invention.

As shown in FIG. 3, a plurality of linear probe marks 1 exists on the electrode pad 3 made of an aluminum thin film. The probe marks 1 made by the wafer test overlap each other at angles close to right angles, in further detail, at angles θ not less than 70 degrees and not over 110 degrees. The preferable angles of overlapping of the probe marks 1 are right angles.

Also, a bonding ball 2, which forms one end of a wire, is connected to the electrode pad 3. A junction region 5 is formed in the region which is a lower part of the bonding ball 2 and also a gap between the probe marks 1. However, by forming the plurality of probe marks 1 as above-mentioned, the junction area 5 may be enlarged compared to the conventional semiconductor device. It is desirable that the junction area 5 is larger than a cross section of the wire 4 (see FIG. 1B).

Next, the method of manufacturing the above-described semiconductor device will be explained.

A plurality of electrode pads 3 made of an aluminum thin film is formed on the vicinity of the periphery of a semiconductor chip.

Next, a wafer test is carried out by pressing a cantilever-type probe against the electrode pad 3. When pressing the probe against the electrode pad 3 for a plurality of times during the wafer test, the angle of the probe to be pressed against the electrode pad 3 for the second time is made so as to make right angles or angles close to right angles with the probe pressed for the first time. To explain in detail, the wafer test is conducted so that the angles of pressing the probe against the electrode pad 3 among the plurality of times are between the degrees of 70 and 110. Therefore, the probe marks 1 left on the electrode pad 3 overlap each other at right angles or angles close to right angles.

Then, the electrode pad 3 on the semiconductor chip is wire-bonded with a lead of the lead frame. That is, the bonding ball 2 is bonded to the electrode pad 3.

Further, a loop pull test is conducted by hooking a hook over the loop of the wire 4 and pulling the hook upwards, in the same manner as in the above-described first embodiment.

As explained above, in the second embodiment, the probe marks 1 overlap each other at angles between the degrees of 70 and 110. Accordingly, since the junction area 5 in the gap between the probe marks may be enlarged compared to the conventional semiconductor device, concentration of tensile stress during loop pull test can be controlled. Thus, peeling of electrode pads 3 during loop pull test can be inhibited.

Next, a variant of the second embodiment of the present invention will be explained.

Figure 4:
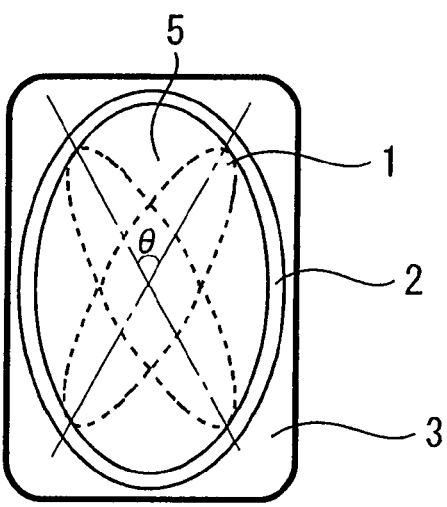
FIG. 4 is a top view for showing a variant of the second embodiment of the present invention.

FIG. 4 is a top view for showing a variant of the second embodiment of the present invention.

As shown in FIG. 4, in the semiconductor device according to the variant, probe marks 1 made in an electrode pad 3 are completely covered by a bonding ball 2. That is, in wire-bonding the electrode pad 3 with the lead, the bonding ball 2 is bonded with the electrode pad 3 so as to completely cover the probe marks 1 made during the wafer test.

According to this variant, the junction area 5 between the probe marks 1 may be further enlarged compared to the above-described second embodiment. Thus, concentration of tensile stress during loop pull test can be further controlled. Furthermore, according to this variant, the same effects as the above-described first embodiment may also be obtained.

Third Embodiment

Similarly to the above-described second embodiment of the present invention, in the third embodiment, concentration of tensile stress during loop pull test is controlled by making appropriate the shape of the probe marks.

Figure 5:
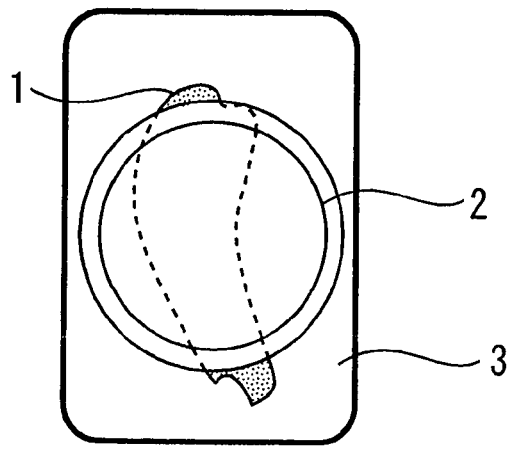
FIG. 5 is a top view for showing the semiconductor device according to a third embodiment of the present invention.

FIG. 5 is a top view for showing the semiconductor device according to the third embodiment of the present invention.

As shown in FIG. 5, probe marks 1 of curved shapes exist in an electrode pad 3.

Also, a bonding ball 2, which forms one end of a wire, is connected to the electrode pad 3. No junction area will be formed in a lower part of the bonding ball 2 since the probe marks 1 are made in the above-mentioned curved shapes.

Next, the method of manufacturing the above-described semiconductor device will be explained.

A plurality of electrode pads 3 made of an aluminum thin film is formed on the vicinity of the periphery of a semiconductor chip.

Next, a wafer test is carried out by pressing a cantilever-type probe against the electrode pad 3 for a plurality of times. During the wafer test, the probe is pressed against the electrode pad 3 while being curved. That is, the probe is pressed for a plurality of times with a curvature so that no junction areas are formed between probe marks 1 as in the second embodiment. Accordingly, curved probe marks 1 are made in the electrode pad 3.

Then, wire-bonding and loop pull test is carried out in the same manner as in the above-described second embodiment.

As explained above, in the third embodiment of the present invention, formation of junction areas between the probe marks 1 is avoided by making the probe marks 1 in curved shapes. For this reason, concentration of tensile stress during loop pull test can be controlled. Accordingly, peeling of electrode pads 3 during loop pull test can be inhibited.

Next, a variant of the third embodiment of the present invention will be explained.

Figure 6:
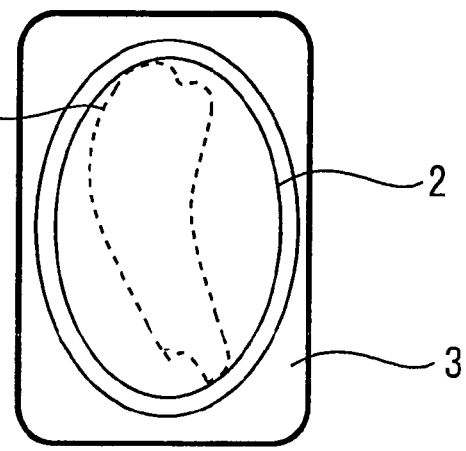
FIG. 6 is a top view for showing a variant of the third embodiment of the present invention.
Figure 7A:
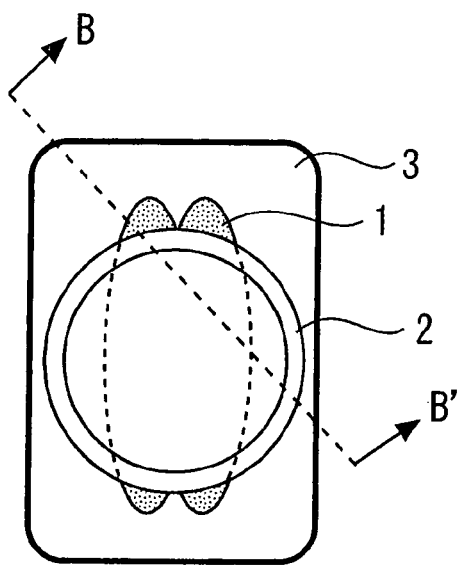
FIGS. 7A, 7B and 8 are diagrams for showing problems in a conventional semiconductor device.
Figure 7B:
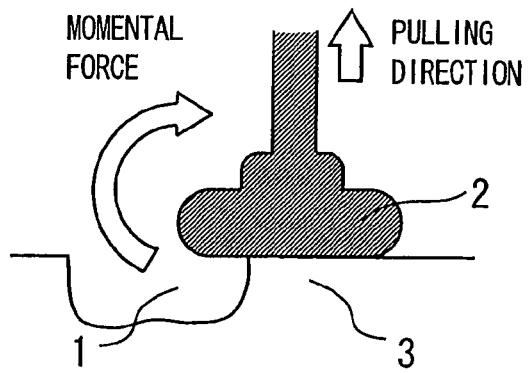

FIG. 6 is a top view for showing a variant of the third embodiment of the present invention.

As shown in FIG. 6, in the semiconductor device according to the variant, probe marks 1 made in an electrode pad 3 are completely covered by a bonding ball 2. That is, in wire-bonding the electrode pad 3 with the lead, the bonding ball 2 is bonded with the electrode pad 3 so as to completely cover the probe marks 1 having curved shapes.

According to this variant, concentration of tensile stress during loop pull test can be further controlled.

A method for manufacturing a semiconductor device comprising: conducting a wafer test by pressing a probe against an electrode pad on a semiconductor chip; wire-bonding for bonding a bonding ball to the electrode pad so as to completely cover probe marks formed in the electrode pad resulting from the wafer test; and conducting a loop pull test after the wire-bonding.

A method for manufacturing a semiconductor device comprising: conducting a wafer test by pressing a probe against an electrode pad for a plurality of times; wire-bonding for bonding a bonding ball to the electrode pad after the wafer test; and conducting a loop pull test after the wire-bonding, wherein the wafer test is conducted so that the angles of pressing the probe among the plurality of times are between degrees of 70 and 110.

In the method of manufacturing a semiconductor device, the wire-bonding is carried out so that the plurality of probe marks made in the electrode pad is completely covered by the bonding ball.

A method of manufacturing a semiconductor device comprising: conducting a wafer test by pressing a probe against an electrode pad for a plurality of times while curving the probe; wire-bonding for bonding a bonding ball to the electrode pad so as to completely cover probe marks made in the electrode pad resulting from the wafer test; and conducting a loop pull test after the wire-bonding.

In the method of manufacturing a semiconductor device, the wire-bonding is carried out so that the plurality of probe marks made in the electrode pad is completely covered by the bonding ball.

Further, the present invention is not limited to these embodiments, but variations and modifications may be made without departing from the scope of the present invention.

The entire disclosure of Japanese Patent Application No. 2003-347899 filed on Oct. 7, 2003 containing specification, claims, drawings and summary are incorporated herein by reference in its entirety.

What is claimed is:

1. A method of manufacturing a semiconductor device, comprising the steps of: performing a wafer test including pressing a probe against an electrode pad on a semiconductor chip, a plurality of probe marks being formed apart from each other on the electrode pad by the pressing of the probe; and wire-bonding, after performing the wafer test, a wiring to the electrode pad so that a bonding ball, which is one end of the wiring, bonded to the electrode pad, covers an entire of an area of the electrode pad including the plurality of probe marks, a periphery of each of the plurality of probe marks not reaching a periphery of the area, wherein the plurality of probe marks are a plurality of dot-like marks or dents.

2. The method of manufacturing a semiconductor device according to claim 1, further comprising the step of performing, after the wire-bonding, a loop test on the wiring.

3. The method of manufacturing a semiconductor device according to claim 1, wherein the probe is a vertical-type probe.

4. The method of manufacturing a semiconductor device according to claim 1, wherein the probe is a thin-type probe.

5. The method of manufacturing a semiconductor device according to claim 1, wherein the electrode pad has no probe mark other than the plurality of probe marks in the area covered with the bonding ball.

* * * * *